(12) United States Patent
Taguchi et al.

(10) Patent No.: US 10,648,216 B2
(45) Date of Patent: May 12, 2020

(54) TOUCH SENSOR UNIT (71) Applicants: AISIN SEIKI KABUSHIKI KAISHA, Kariya-shi (JP); NISHIKAWA RUBBER CO., LTD., Hiroshima-shi (JP)

(72) Inventors: Tomohiro Taguchi, Nagoya (JP); Hironori Koeda, Gifu (JP); Michihiko Matsumoto, Hiroshima (JP); Takashi Fukushima, Hiroshima (JP)

(73) Assignees: AISIN SEIKI KABUSHIKI KAISHA, Kariya-shi (JP); NISHIKAWA RUBBER CO., LTD., Hiroshima-shi (JP)

( * ) Notice: Subject to any disclaimer, the term of this patent is extended or adjusted under 35 U.S.C. 154(b) by 0 days.

(21) Appl. No.: 15/988,068

(22) Filed: May 24, 2018

(65) Prior Publication Data
US 2018/0348945 A1 Dec. 6, 2018

(30) Foreign Application Priority Data
May 30, 2017 (JP) ................................ 2017-106514

(51) Int. Cl.
| | |
|---|---|
| E05F 15/44 | (2015.01) |
| G06F 3/041 | (2006.01) |
| G06F 3/047 | (2006.01) |
| H03K 17/975 | (2006.01) |
| H03K 17/96 | (2006.01) |

(Continued)

(52) U.S. Cl.
CPC .............. *E05F 15/44* (2015.01); *E05F 15/42* (2015.01); *G06F 3/047* (2013.01); *G06F 3/0414* (2013.01); *H03K 17/962* (2013.01); *H03K 17/975* (2013.01); *B60J 5/00* (2013.01); *B60J 10/273* (2016.02); *B60K 2370/143* (2019.05); *H03K 2217/96078* (2013.01)

(58) Field of Classification Search
CPC .... E05F 15/42; E05F 15/44; B60J 5/00; B60J 10/273
See application file for complete search history.

(56) References Cited

U.S. PATENT DOCUMENTS

| | | | | |
|---|---|---|---|---|
| 4,255,903 A | * | 3/1981 | Reynolds .............. | E06B 7/2318 49/479.1 |
| 6,954,139 B2 | * | 10/2005 | Ueda ....................... | E05F 15/42 310/319 |

(Continued)

FOREIGN PATENT DOCUMENTS

| | | | | |
|---|---|---|---|---|
| FR | 2654458 A1 | * | 5/1991 | .............. B60J 10/24 |
| JP | 2000-25460 | | 1/2000 | |

(Continued)

*Primary Examiner* — Gregory J Strimbu
(74) *Attorney, Agent, or Firm* — Oblon, McClelland, Maier & Neustadt, L.L.P.

(57) ABSTRACT

A touch sensor unit includes a pressure-sensitive sensor and a support that supports the pressure-sensitive sensor. The support includes a first portion that is folded and overlapped with a second portion of the support to at least partially enclosed and support the sensor. One of the first portion and the second portion includes a groove, and the other of the first portion and the second portion includes a projection that projects toward the groove. The projection is fitted into the groove.

6 Claims, 8 Drawing Sheets (51) Int. Cl.
*E05F 15/42* (2015.01)
*B60J 5/00* (2006.01)
*B60J 10/273* (2016.01)

(56) References Cited

U.S. PATENT DOCUMENTS

| | | | | |
|---|---|---|---|---|
| 6,962,228 | B2* | 11/2005 | Ogino | B60J 10/00 |
| | | | | 180/274 |
| 7,893,831 | B2 | 2/2011 | Hoshina et al. | |
| 8,312,675 | B2* | 11/2012 | Thiele | E05F 15/42 |
| | | | | 49/27 |
| 8,479,449 | B2* | 7/2013 | Titz | B60J 10/78 |
| | | | | 49/440 |
| 8,752,332 | B2* | 6/2014 | Thiele | B60J 5/06 |
| | | | | 49/27 |
| 2004/0085217 | A1* | 5/2004 | Ueda | E05F 15/42 |
| | | | | 340/686.1 |
| 2011/0047879 | A1* | 3/2011 | Shimizu | E05F 15/44 |
| | | | | 49/358 |
| 2014/0339842 | A1* | 11/2014 | Kawaguchi | B60J 5/0495 |
| | | | | 296/1.04 |

FOREIGN PATENT DOCUMENTS

| | | |
|---|---|---|
| JP | 3686061 | 8/2005 |
| JP | 2010-272277 | 12/2010 |
| JP | 2011-117827 | 6/2011 |
| JP | 4828467 | 11/2011 |
| JP | 4900064 | 3/2012 |

\* cited by examiner

TOUCH SENSOR UNIT

BACKGROUND OF THE INVENTION

The present invention relates to a touch sensor unit coupled to an edge of a vehicle door or the like to detect contact with an obstacle.

Figure 12:
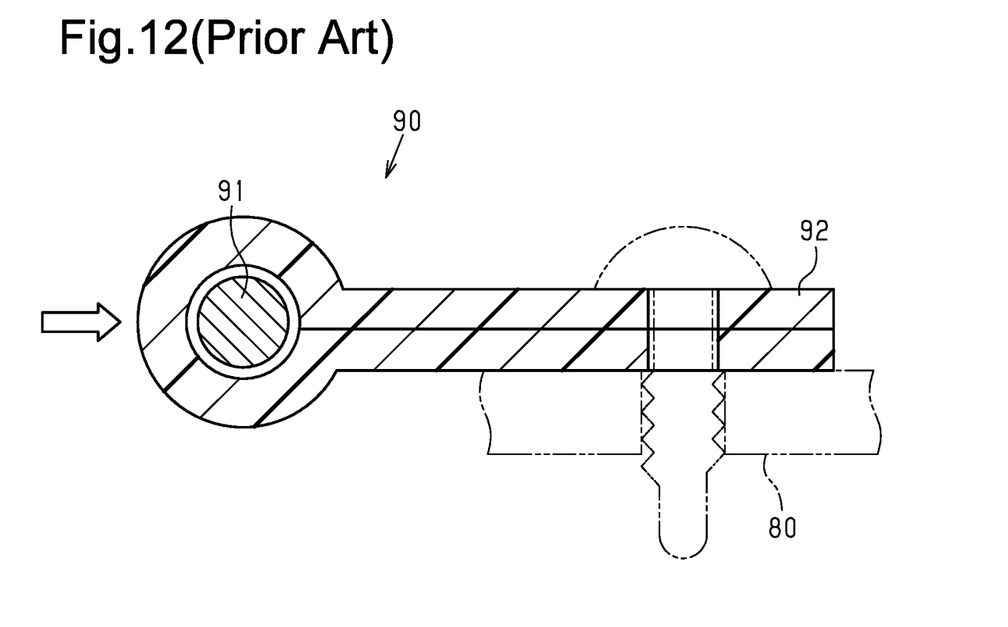
FIG. 12 is a cross-sectional view showing a prior-art touch sensor unit.

As shown in FIG. 12, Japanese Patent No. 4828467 describes a touch sensor unit 90 that supports a cable-shaped pressure-sensitive sensor 91 with a support 92 and is coupled to a flange 80 arranged on an edge of a vehicle door.

Figure 13:
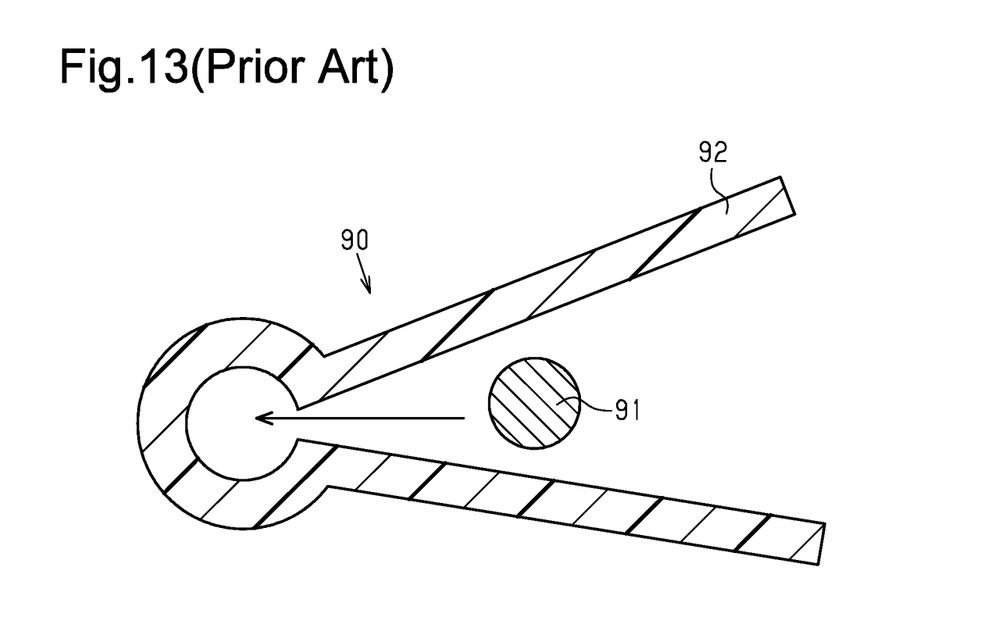
FIG. 13 is a cross-sectional view illustrating how a pressure-sensitive sensor is coupled in the prior-art touch sensor unit.

The touch sensor unit 90 described in the above publication includes a portion where the pressure-sensitive sensor 91 is curved. As shown in FIG. 13, the folded support 92 is opened to place the curved portion of the pressure-sensitive sensor 91 between the overlapping portions of the folded support 92. Then, as shown in FIG. 12, the support 92 is closed with the pressure-sensitive sensor 91 accommodated in the portion where the support is bent and folded.

When forming a hole for insertion of a pressure-sensitive sensor in advance, it will be difficult to form the hole if the hole is curved midway. Further, even if such a curved hole can be formed, it will be difficult to insert the pressure-sensitive sensor into the curved hole.

When enclosing the pressure-sensitive sensor in the folded support as described above, the pressure-sensitive sensor can be curved more easily than when forming a hole in the support for insertion of the pressure-sensitive sensor.

However, in the construction for enclosing the pressure-sensitive sensor in the folded support, when force acts to press the pressure-sensitive sensor 91 against the overlapping portions of the support 92 as shown by the arrow in FIG. 12, force acts to separate the overlapping portions of the support 92 from each other. This may open the folded support 92 near the pressure-sensitive sensor 91. As a result, the pressure-sensitive sensor 91 may enter the open part and be supported at an inappropriate position. Such a problem may also occur when joining the overlapping portions of the support 92 with an adhesive or the like.

SUMMARY OF THE INVENTION

In order to achieve the above object, a touch sensor unit according to one aspect includes a pressure-sensitive sensor and a support that supports the pressure-sensitive sensor. The support includes a portion that is folded and overlapped with another portion of the support. The pressure-sensitive sensor is at least partially enclosed by the folded portion of the support and supported by the support. The overlapping portions of the support include a part adjacent to the pressure-sensitive sensor where two surfaces of the support are opposed to each other. One of the two surfaces includes a groove, and the other one of the two surfaces includes a projection that projects toward the groove. The projection is fitted into the groove.

In the above structure, when the pressure-sensitive sensor is pressed against the overlapping portions of the support, the projection pressed by the pressure-sensitive sensor is pressed against the side surface of the groove. Thus, in the above structure, even if the pressure-sensitive sensor is pressed against the overlapping portions of the support, the projection is pressed against the side surface of the groove. This restricts separation of the projection 323 from the groove. Thus, the overlapping portions of the support resist opening and properly support the pressure-sensitive sensor.

It is preferred that the overlapping portions of the support include joined parts where the overlapping portions are adhered to each other. It is preferred that that the projection be located between the joined parts and the pressure-sensitive sensor.

In the above structure, when the pressure-sensitive sensor is pressed against the joined parts, the projection is pressed against the side surface of the groove. Thus, the overlapping portions of the support resist opening and consequently restrict separation of the joined parts.

It is preferred that the support include a main body including a metal insert and an elastomer that covers the metal insert and a lip connected to the main body, formed from an elastomer, and free from the metal insert. It is preferred that the lip be folded over the main body to enclose the pressure-sensitive sensor and overlapped with the main body.

The pressure-sensitive sensor is enclosed by elastically deforming the lip, which is free from the inserts, to accommodate the pressure-sensitive sensor in the support. Since the inserts are embedded in the main body, deformation of the main body is limited. This allows the support to properly support the pressure-sensitive sensor.

It is preferred that in the overlapping portions of the support where the two surfaces of the support are opposed to each other, the groove be located in a surface of the main body and the projection be located on a surface of the lip.

When the surface of the lip includes a groove, elastic deformation of the lip easily changes the shape of the groove. This hinders fitting of a projection into the gap and obstructs positioning of the lip. If the groove is located in the surface of the main body that has a higher rigidity than the lip. This limits deformation of the groove and facilitates the fitting of the projection into the groove.

It is preferred that a protrusion project from a surface of the main body and that a distal end of the lip overlapped with the main body abut against the protrusion.

As described above, a protrusion that differs from the projection projects from the surface of the main body, and the distal end of the lip abuts against the protrusion. This allows the lip, which is overlapped with the main body, to be positioned using the protrusion as a reference.

It is preferred that the groove include a side surface that is inclined so as to become deeper toward the pressure-sensitive sensor and that the projection include a side surface that is inclined so as to become higher toward the pressure-sensitive sensor.

In the above structure, as long as the distal end of the projection is inserted into the groove, the projection can be moved along the side surface of the groove toward the pressure-sensitive sensor by pressing the support so that the two surfaces opposed to each other in the overlapped support press each other. That is, the projection can be positioned by using the inclinations of the side surfaces of the groove and the projection as guides for properly positioning the projection.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

One embodiment of a touch sensor unit coupled to a power sliding door of a vehicle will now be described with reference to the drawings.

Figure 1:
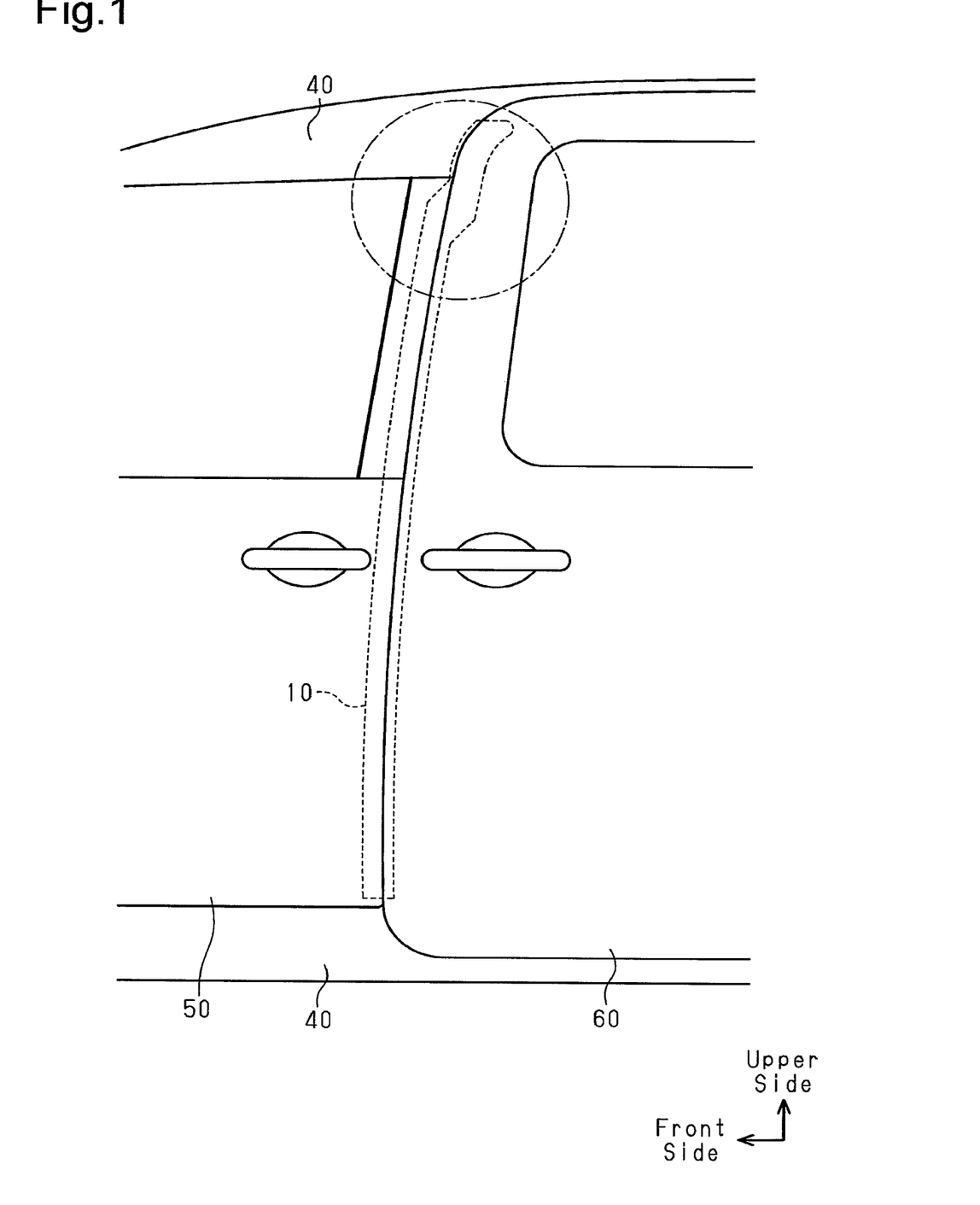
FIG. 1 is a side view showing a vehicle where one embodiment of a touch sensor unit is arranged.

First, a vehicle to which a touch sensor unit 10 of this embodiment is coupled will be described with reference to FIG. 1. FIG. 1 is a left side view of the vehicle showing the vicinity of a front end of a rear door 60.

The rear door 60 of this vehicle is a power sliding door that opens when moved toward the rear of the vehicle from the state shown in FIG. 1. As shown by the broken line in FIG. 1, the touch sensor unit 10 is coupled to a front edge of the rear door 60.

A front end of a front door 50 of this vehicle is coupled to a vehicle body 40 by hinges, and a rear end of the front door 50 opens outward about the front end. In this vehicle, as shown in FIG. 1, in a state in which the front door 50 and the rear door 60 are closed, a front edge of the touch sensor unit 10 is covered by the rear end of the front door 50 from the outer side.

Further, in this vehicle, an upper edge of the front door 50 is located downward from an upper edge of the rear door 60. Thus, in this vehicle, a portion of the touch sensor unit 10 located upward from the front door 50 opposes the vehicle body 40 with a slight gap in a front-to-rear direction without being covered by the front door 50. In FIG. 1, to facilitate understanding, the front edge of the touch sensor unit 10 at this portion is shown located slightly toward the front from a parting line of the vehicle body 40.

The touch sensor unit 10 will now be described. As shown in FIG. 1, the touch sensor unit 10 is elongated in a vertical direction from the vicinity of an upper end of the rear door 60 to the vicinity of a lower end of the front door 50.

Figure 2:
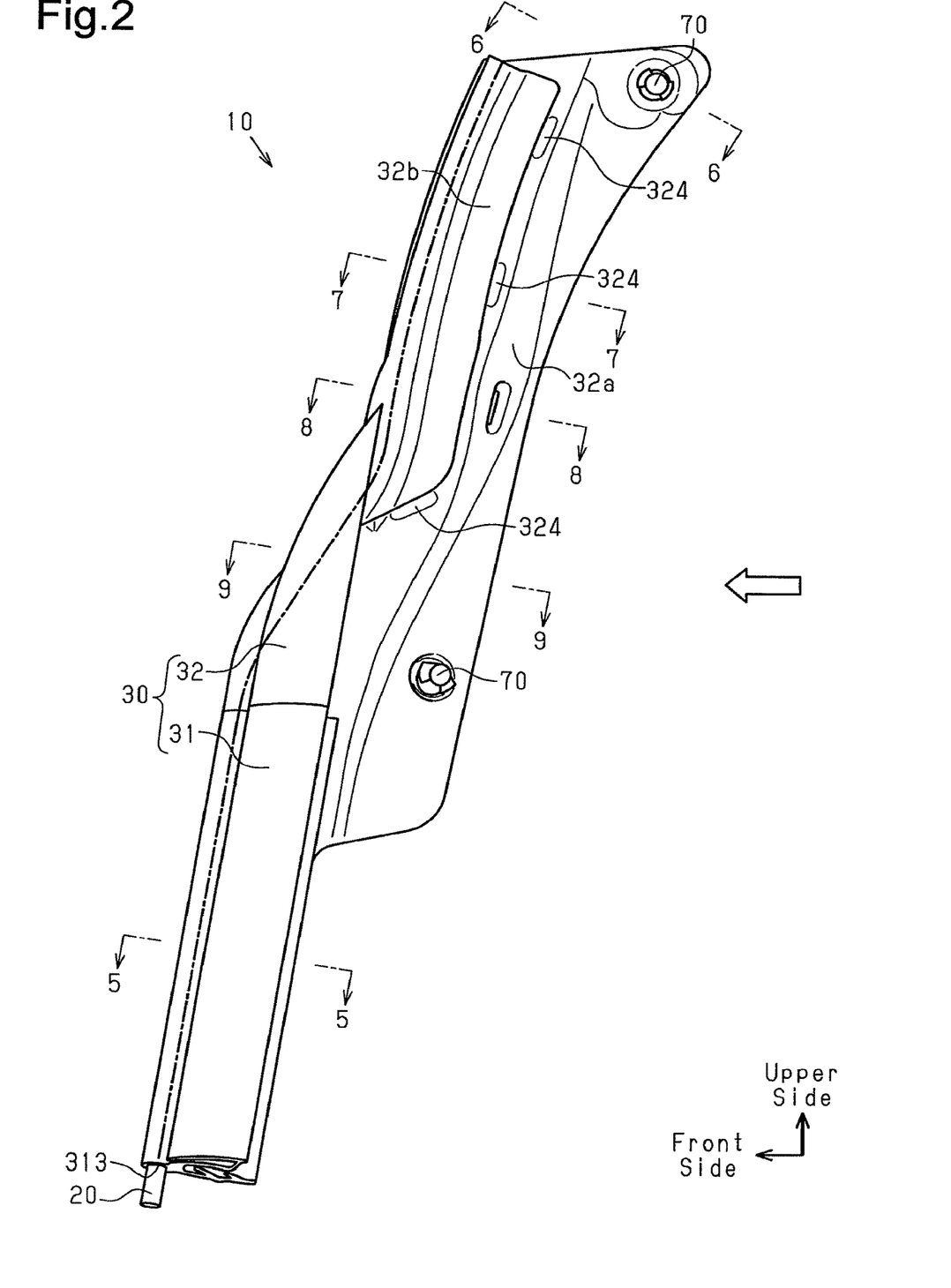
FIG. 2 is a perspective view showing the upper part of the touch sensor unit illustrated in FIG. 1.
Figure 3:
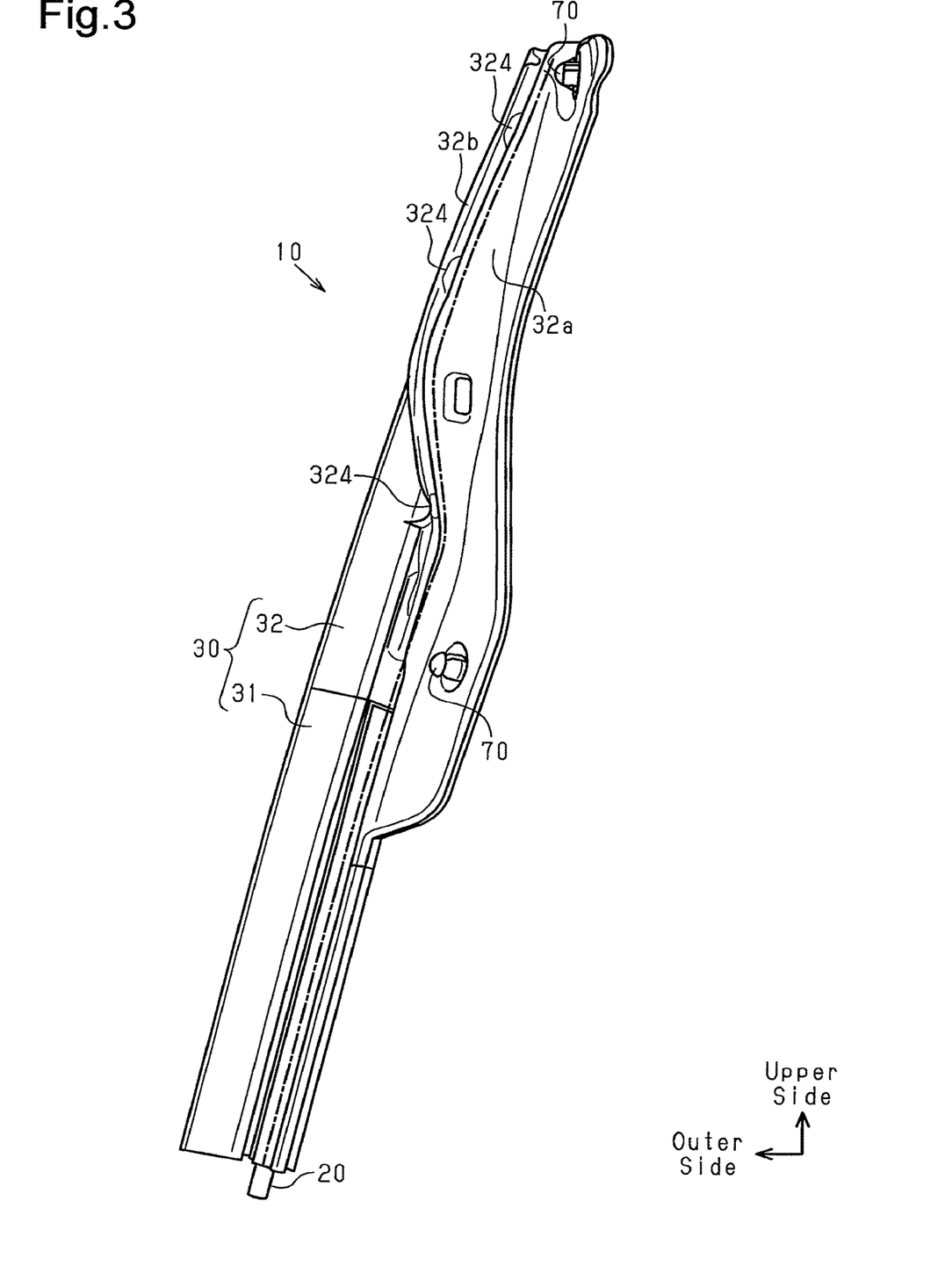
FIG. 3 is a perspective view showing the touch sensor unit as viewed in the direction of an arrow illustrated in FIG. 2.

As shown in FIGS. 2 and 3, the touch sensor unit 10 is a combination of a cable-shaped pressure-sensitive sensor 20 and a support 30 that supports the pressure-sensitive sensor 20 at the front edge of the rear door 60. The support 30 is mainly formed from elastomer, that is, a rubber elastic body, and can be formed from a rubber material such as ethylene propylene diene monomer (EPDM) rubber and various thermoplastic elastomers such as olefinic thermoplastic elastomers, styrenic thermoplastic elastomers, and polyvinyl chloride (PVC). Here, the support 30 is mainly formed from an olefinic thermoplastic elastomer. Further, the support 30 includes an extruded portion 31 formed through extrusion and an injection-molded portion 32 through, for example, injection molding using a mold.

FIG. 2 is a perspective view showing the part of the touch sensor unit 10 encircled by a single-dashed line in FIG. 1. FIG. 3 is a perspective view of the part shown in FIG. 2 in the direction indicated by the arrow in FIG. 2. A portion of the touch sensor 10 covered by the front door 50 from the outer side is referred to as the extruded portion 31, and an upper portion of the touch sensor 10 that is not covered by the front door 50 is referred to as the injection-molded portion 32. In FIGS. 2 and 3, the central position of the pressure-sensitive sensor 20 covered by the support 30 is indicated by a single-dashed line.

Figure 4:
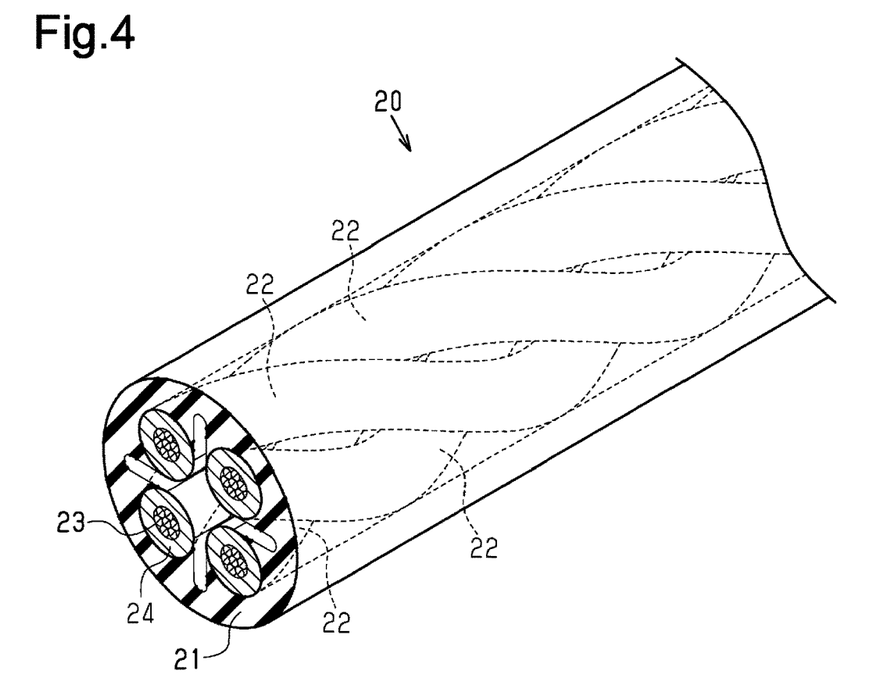
FIG. 4 is a perspective, cross-sectional view showing the pressure-sensitive sensor of FIG. 1.

As shown in FIG. 4, the pressure-sensitive sensor 20 is formed by spirally arranging four electrode wires 22 in a support tube 21. The support tube 21 is formed from an insulative, elastic resin. Each electrode wire 22 is formed by covering a central electrode 23, in which conductive fine wires are intertwisted, with conductive rubber 24. In the pressure-sensitive sensor 20, the four electrode wires 22 are spaced apart from one another and spirally embedded in the wall surface of the support tube 21. The four electrode wires 22 are connected to one another by a resistor to configure a circuit. The electrode wires 22 come into contact and short when the pressure-sensitive sensor 20 is deformed. In such a case, current does not flow through the resistor. The pressure-sensitive sensor 20 is a sensor that uses such a principle to detect the application of an external pressing force from a change in the value of current flowing through the circuit.

In the touch sensor unit 10, the pressure-sensitive sensor 20 is supported by the support 30 and laid out along the front edge of the rear door 60. The touch sensor unit 10 detects contact with an obstacle when the rear door 60 is moving in a closing direction.

As shown in FIGS. 1 and 2, a front edge of the extruded portion 31 is located frontward from a front edge of the injection-molded portion 32. Thus, as shown in FIG. 2, in the extruded portion 31, the pressure-sensitive sensor 20 that is laid out along a front edge of the support 30 is located frontward from the front edge of the injection-molded portion 32. Further, as shown in FIG. 3, the position where the injection-molded portion 32 supports the pressure-sensitive sensor 20 is shifted outward as the extruded portion 31 becomes farther in the upward direction. In this manner, in the touch sensor unit 10, the extruded portion 31 and the injection-molded portion 32 support the pressure-sensitive sensor 20 at different positions. Thus, the support 30 supports the pressure-sensitive sensor 20 in a state curved midway.

The extruded portion 31 is entirely formed from an olefinic thermoplastic elastomer and has the same shape from top to bottom. Thus, the extruded portion 31 can be easily manufactured through extrusion.

Figure 5:
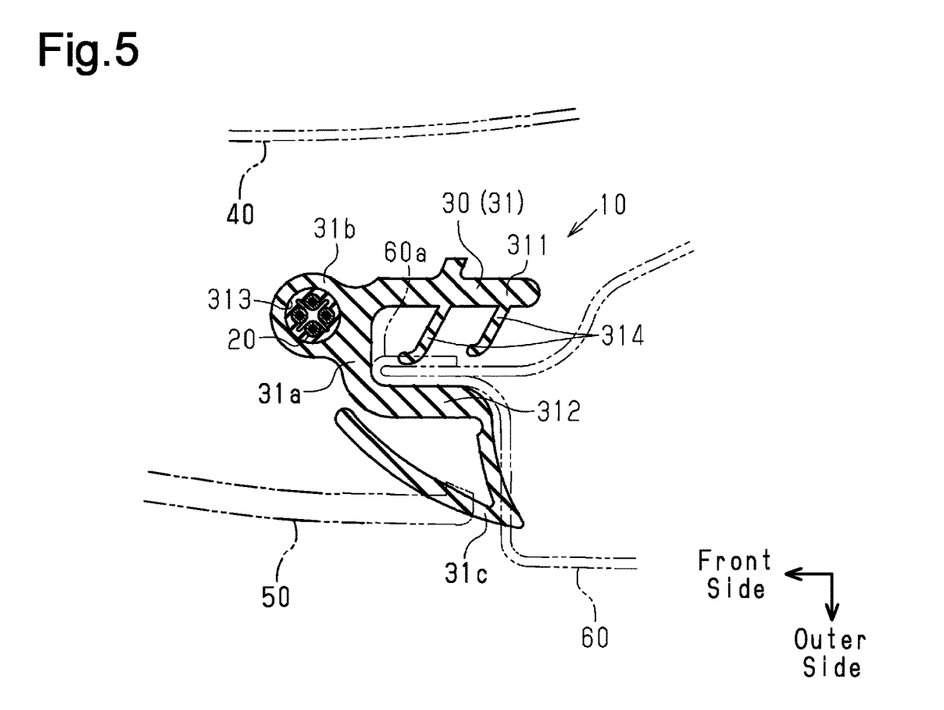
FIG. 5 is a cross-sectional view taken along line 5-5 in FIG. 2.

As shown in FIGS. 2 and 5, the extruded portion 31 includes an accommodation hole 313 that accommodates the pressure-sensitive sensor 20. In the extruded portion 31 of the support 30, the pressure-sensitive sensor 20 is inserted into the accommodation hole 313 to support the pressure-sensitive sensor 20.

As shown in FIG. 5, the extruded portion 31 includes a groove-shaped main body 31a, an accommodation portion 31b, and a seal 31c. The main body 31a includes a first side wall 311 and a second side wall 312 that extend in parallel and are spaced apart from each other. Two engagement pieces 314 project from the first side wall 311 toward the second side wall 312.

When coupling the extruded portion 31 of the support 30 to the rear door 60, the extruded portion 31 is coupled, from the front, to a flange 60a projecting frontward from the front end of the rear door 60 to fit the flange 60a between the first side wall 311 and the second side wall 312 of the main body 31a as shown by the double-dashed line. Thus, when the support 30 is coupled to the rear door 60, the flange 60a is placed between the first side wall 311 and the second side wall 312 of the main body 31a as shown by the double-dashed line. The engagement pieces 314 restrict separation of the support 30 from the flange 60a. A core formed from metal or hard resin may be embedded in the main body 31a.

As shown in FIG. 5, the accommodation portion 31b is located at a side opposite to an opening of the main body 31a into which the flange 60a is fitted, and the accommodation portion 31b is arranged where the front edge of the extruded portion 31 is located in a state in which the support 30 is coupled to the rear door 60. As described above, the accommodation portion 31b includes the accommodation hole 313 that accommodates the pressure-sensitive sensor 20. As shown in FIG. 5, the accommodation hole 313 accommodates the pressure-sensitive sensor 20.

Among the first side wall 311 and the second side wall 312, which are two side walls of the main body 31a, the seal 31c is connected to the second side wall 312 that is located at the outer side of the vehicle when the support 30 is coupled to the rear door 60. As shown in FIG. 5, the seal 31c extends from a distal end of the second side wall 312 toward the outer side of the vehicle and is bent midway toward the front of the vehicle so as to form a hollow post. Thus, the seal 31c abuts against the rear door 60. Further, when the front door 50 is closed, the rear end of the front door 50 abuts against the seal 31c and seals the gap between the front door 50 and the rear door 60 as shown by the double-dashed line in FIG. 5 in a state in which the front door 50 is closed.

As shown in FIGS. 2, 3, and 6 to 9, the injection-molded portion 32 includes a flat main body 32a and is coupled to the rear door 60 by clips 70. In the same manner as the extruded portion 31, the injection-molded portion 32 is formed from olefinic thermoplastic elastomers. In contrast with the extruded portion 31 that is entirely formed from an olefinic thermoplastic elastomer, inserts 321 formed by pressing stainless steel plates are embedded in the main body 32a of the injection-molded portion 32 as shown in FIGS. 6 to 9.

Figure 6:
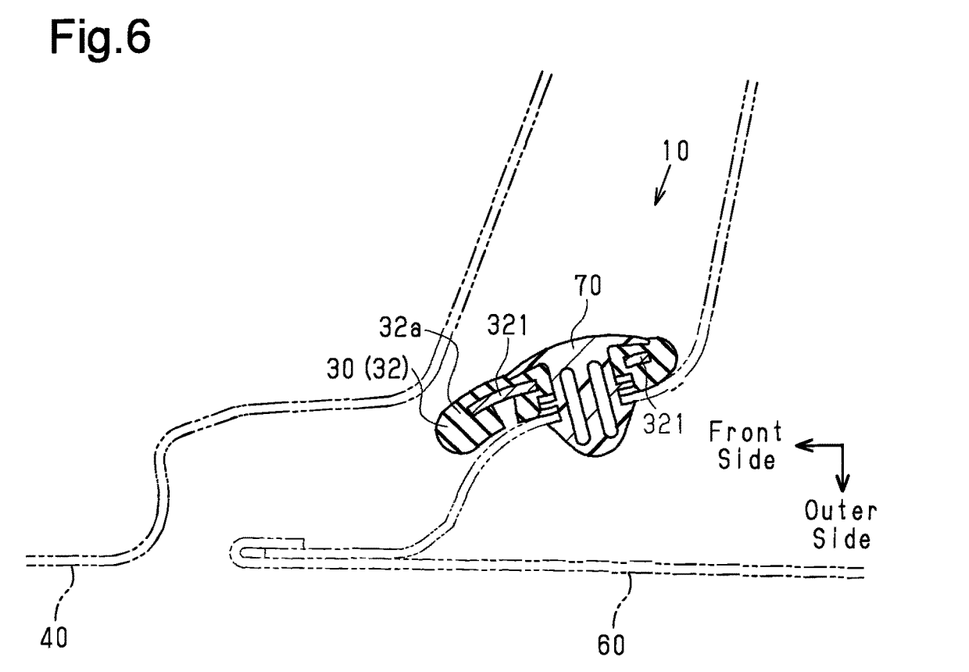
FIG. 6 is a cross-sectional view taken along line 6-6 in FIG. 2.

As shown in FIG. 6, the injection-molded portion 32 is coupled to the rear door 60 by placing the flat main body 32a, in which the inserts 321 are embedded, on an inner surface of the rear door 60 of the vehicle and fastening the main body 32a to the rear door 60 with the clips 70, which are formed from resin.

Figure 7:
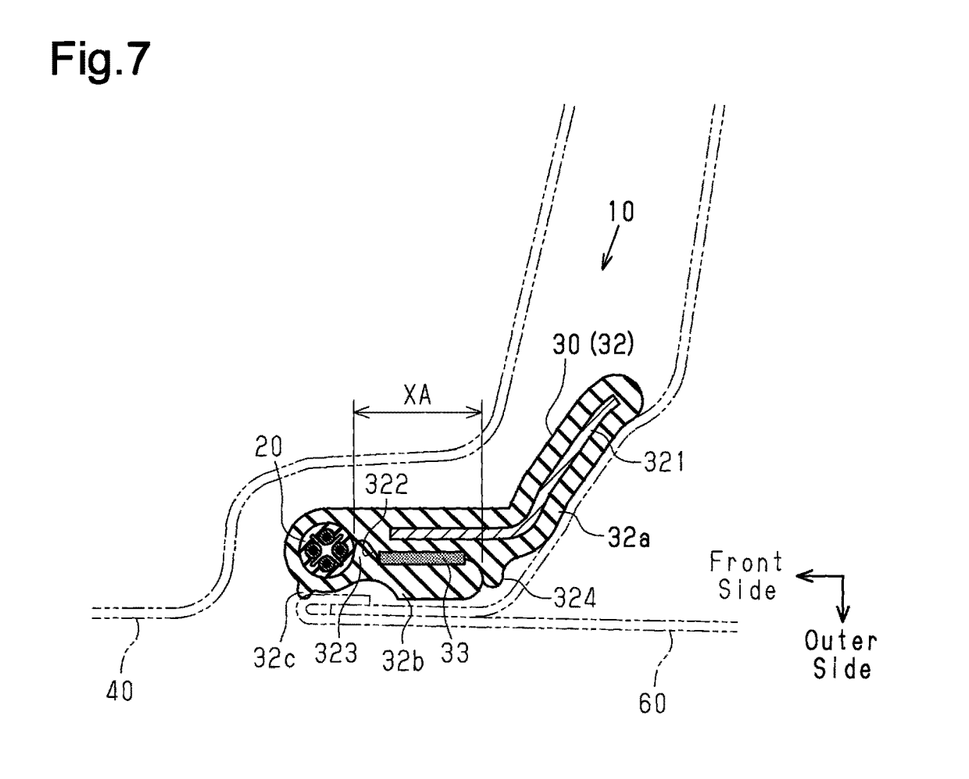
FIG. 7 is a cross-sectional view taken along line 7-7 in FIG. 2.
Figure 8:
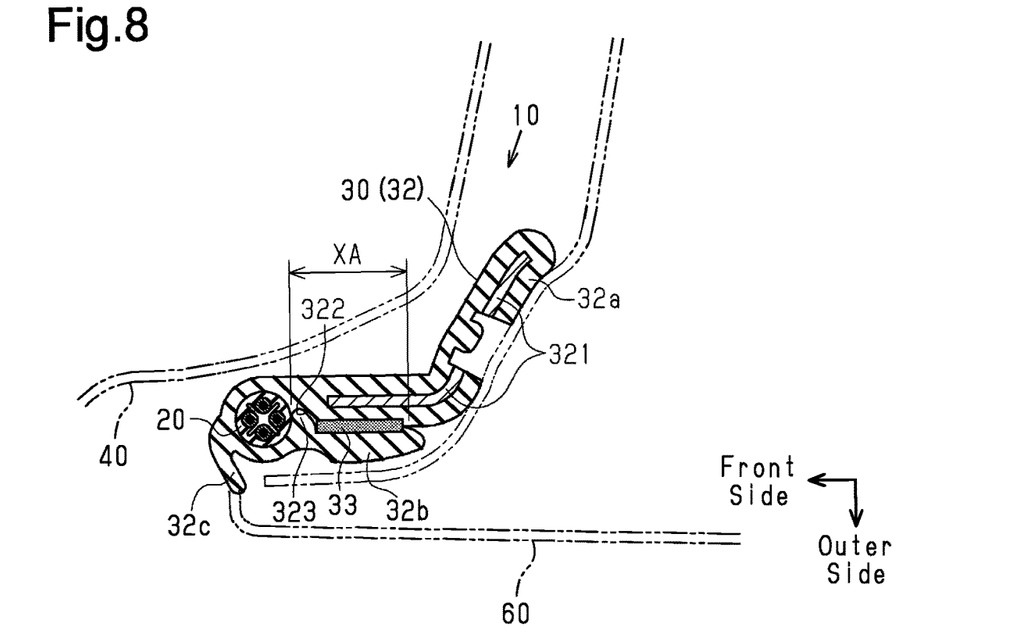
FIG. 8 is a cross-sectional view taken along line 8-8 in FIG. 2.
Figure 9:
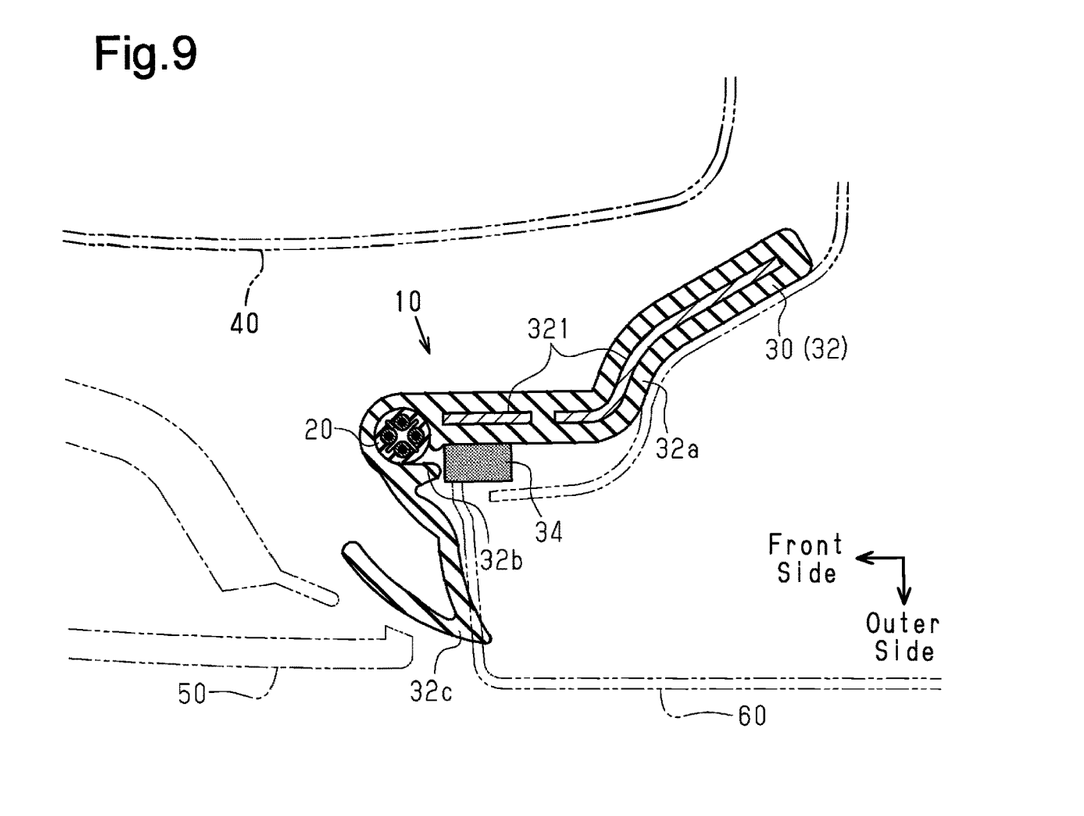
FIG. 9 is a cross-sectional view taken along line 9-9 in FIG. 2.

As shown in FIGS. 7 to 9, the injection-molded portion 32 includes the flat main body 32a, which covers the inserts 321 with an olefinic thermoplastic elastomer, a lip 32b, and a seal 32c. The lips 32b and the seal 32c are connected to the main body 32a and free from the inserts 321 The lip 32b is connected to a front end of the main body 32a and folded overt the outer side of the vehicle (toward the main body 32a) to enclose the pressure-sensitive sensor 20.

As shown in FIGS. 7 and 8, the lip 32b is overlapped with the main body 32a. An adhesive tape 33 is sandwiched by the overlapping portions of the support 30 (portions indicated by region XA in FIGS. 7 and 8). The support 30 includes joined parts that are adhered by the adhesive tape 33.

Further, parts of the overlapping portions of the support 30 that are adjacent to the pressure-sensitive sensor 20, that is, the front ends of the overlapping portions, include two surfaces of the support 30 that are opposed to each other. One of the two surfaces, that is, the surface of the main body 32a, includes a single groove 322. The other one of the two surfaces, that is, the surface of the lip 32b, includes a single projection 323. The groove 322 and the projection 323 are elongated along the pressure-sensitive sensor 20. The groove 322 includes a side surface inclined so as to become deeper toward the pressure-sensitive sensor 20, and the projection 323 includes a side surface inclined so as to become higher toward the pressure-sensitive sensor 20. The side surfaces are in planar contact with each other. The projection 323 enters the groove 322 so that the projection 323 is fitted into the groove 322. In this manner, in the touch sensor unit 10, the projection 323 is located between the pressure-sensitive sensor 20 and the joined parts where the support 30 is adhered.

As shown in FIGS. 2 and 3, three protrusions 324 project from the surface of the main body 32a. As shown in FIG. 7, the lip 32b is adhered to the main body 32a in a state in which a distal end of the lip 32b abuts against the protrusions 324.

In this manner, in the injection-molded portion 32, the pressure-sensitive sensor 20 is enclosed by the lip 32b, which is folded from the front end of the main body 32a, and the pressure-sensitive sensor 20 is accommodated by coupling the lip 32b to the main body 32a. Further, the pressure-sensitive sensor 20 is supported at the front edge of the support 30 in a state in which the support 30 is coupled to the rear door 60.

As shown in FIG. 9, in the injection-molded portion 32, the part of the lip 32b proximate to the extruded portion 31 is short and thus does not reach the main body 32a. In this part, a sponge 34 that is taller than the adhesive tape 33 is applied to the main body 32a. The sponge 34 abuts against the rear door 60 and restricts separation of the pressure-sensitive sensor 20 from the support 30.

Further, as shown in FIGS. 7 to 9, the seal 32c is connected to the lip 32b. As shown in FIG. 9, the seal 32c extends toward the outer side of the vehicle from a portion of the lip 32b that encloses the pressure-sensitive sensor 20. In the same manner as the seal 31c of the extruded portion 31, the seal 32c is bent midway toward the front of the vehicle so as to form a hollow post. Thus, the seal 32c abuts against the rear door 60. As shown by the double-dashed line in FIG. 9, the seal 32c is covered from the outer side by the rear end of the front door 50 in a state in which the front door 50 is closed.

The front end of the rear door 60 becomes thinner toward the upper side, and the main body 32a becomes closer to the outer surface of the vehicle. Further, as described above, the upper end of the touch sensor unit 10 is not covered by the front door 50 from the outer side. Thus, the seal 32c of the injection-molded portion 32 gradually becomes smaller toward the upper side. More specifically, at the position shown in FIG. 7 and the position shown in FIG. 8, the seal 32c is a rib or projection that slightly projects from the lip 32b toward the outer side of the vehicle and abuts against the inner surface of the rear door 60 of the vehicle.

In this manner, the injection-molded portion 32 has different shapes at different positions in the vertical direction. Thus, the injection-molded portion 32 is formed by performing injection molding in a state in which the inserts 321 are arranged in the mold. When forming the injection-molded portion 32, injection molding is performed in a state in which the extruded portion 31 and the inserts 321 are set in the mold. This allows the extruded portion 31 and the injection-molded portion 32 to be coupled when manufacturing the support 30.

When coupling the pressure-sensitive sensor 20 to the support 30 manufactured in this manner, the pressure-sensitive sensor 20 is first inserted into the accommodation hole 313 from the lower end of the extruded portion 31. Then, the pressure-sensitive sensor 20 is drawn out of the upper end of the extruded portion 31.

Figure 10:
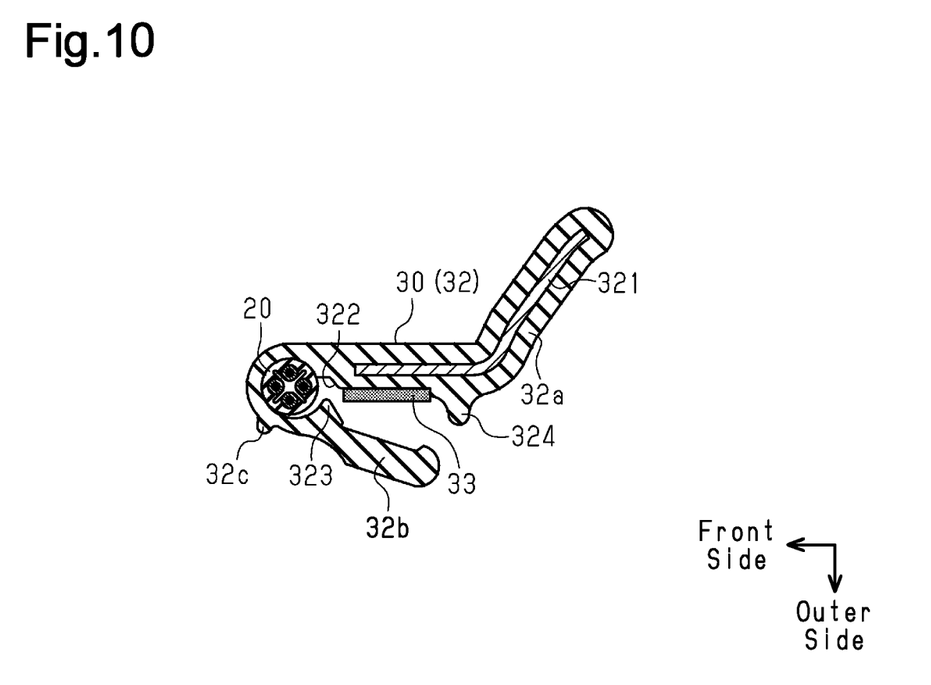
FIG. 10 is a cross-sectional view showing the touch sensor unit of FIG. 7 in a state before a lip is adhered.

As shown in FIG. 10, the lip 32b of the injection-molded portion 32 encloses the pressure-sensitive sensor 20 and accommodates the pressure-sensitive sensor 20 in the support 30. The adhesive tape 33 is applied to the surface of the main body 32a in advance and the lip 32b is overlapped with the main body 32a, to which the adhesive tape 33 is applied. This adheres the main body 32a to the lip 32b. When enclosing the pressure-sensitive sensor 20 by overlapping the lip 32b with the main body 32a in this manner, the lip 32b is positioned using the protrusion 324 projecting from the surface of the main body 32a as a reference to overlap the lip 32b with the main body 32a at a position where a distal end of the lip 32b abuts against the protrusion 324. Further, the lip 32b is overlapped with the main body 32a in a state in which a distal end of the projection 323 projecting from the lip 32b is inserted into the groove 322. Then, the lip 32b is pressed against the main body 32a in close contact to adhere the lip 32b to the main body 32a.

When the lip 32b is pressed against the main body 32a in this manner, the projection 323 is moved along the side surface of the groove 322 toward the pressure-sensitive sensor 20 and fitted into the groove 322. Further, when moved forward in this manner, the projection 323 presses the pressure-sensitive sensor 20 and moves the pressure-sensitive sensor 20 toward the front to adjust the position of the pressure-sensitive sensor 20 and reduce the gap between the lip 32b, which encloses the pressure-sensitive sensor 20, and the pressure-sensitive sensor 20.

The pressure-sensitive sensor 20 is coupled to the support 30 in this manner. In the touch sensor unit 10, the pressure-sensitive sensor 20 is laid out along the front edges of the extruded portion 31 and the injection-molded portion 32 while being curved midway from the extruded portion 31 to the injection-molded portion 32.

Figure 11:
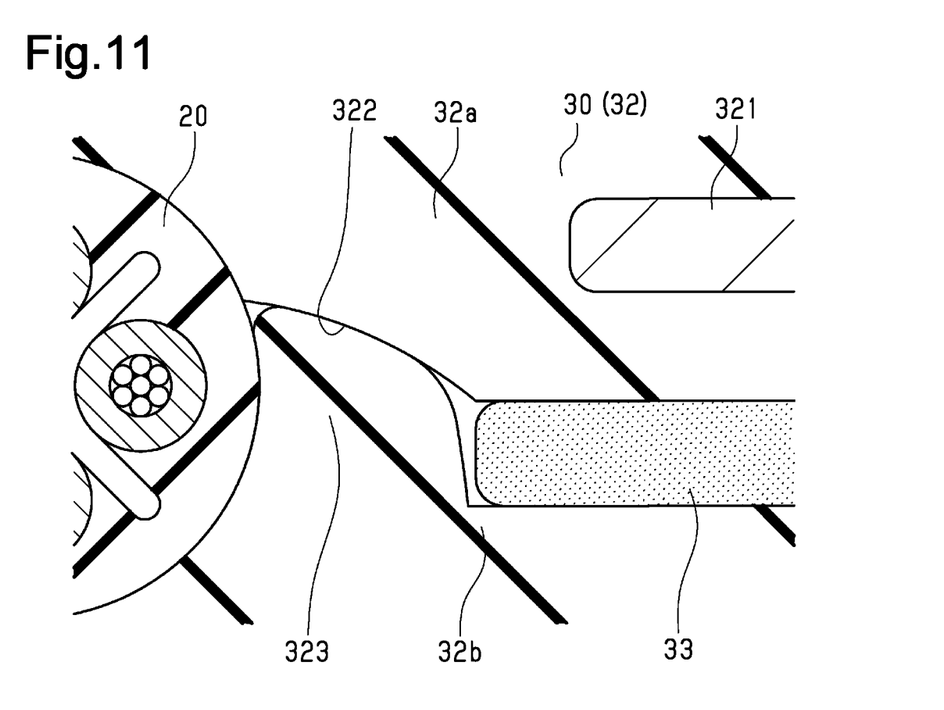
FIG. 11 is an enlarged cross-sectional view showing the touch sensor unit of FIG. 7.

The operation of the touch sensor unit 10 of the present embodiment will now be described with reference to FIGS. 11 and 12. FIG. 11 is an enlarged cross-sectional view showing a portion where the groove 322 and the projection 323 of the touch sensor unit 10 are fitted, which is shown in FIG. 7. FIG. 12 is a cross-sectional view showing the structure of a prior-art touch sensor unit as a comparative example.

As shown in FIG. 12, if the overlapping portions of the support 92 do not include a groove and a projection, when force acts to press the pressure-sensitive sensor 91 against the overlapping portions of the support 92 as shown in the arrow, force acts to separate the overlapping portions of the support 92 from each other. This opens the folded support 92 near the pressure-sensitive sensor 91 and causes the pressure-sensitive sensor 91 to enter the opening. In such a case, the pressure-sensitive sensor 91 will be supported at an inappropriate position. When the overlapping portions of the support 92 are separated in this manner and the pressure-sensitive sensor 91 is displaced, contact with an obstacle cannot be detected properly.

As shown in FIG. 11, in the touch sensor unit 10, the groove 322 and the projection 323 are formed adjacent to the pressure-sensitive sensor 20 where the main body 32a and the lip 32b are overlapped in the support 30. The groove 322 is fitted into the projection 323. The inclined surfaces of the groove 322 and the projection 323 are in planar contact with each other. When the pressure-sensitive sensor 20 is pressed against the overlapping portions of the support 30, the projection 323 pressed by the pressure-sensitive sensor 20 is pressed against the side surface of the groove 322. Thus, in the touch sensor unit 10, even if the pressure-sensitive sensor 20 is pressed against the overlapping portions of the support 30, the projection 323 is pressed against the side surface of the groove 322. This restricts separation of the projection 323 from the groove 322.

The described embodiment has the advantages described below.

(1) Even if the pressure-sensitive sensor 20 is pressed against the overlapping portions of the support 30, the projection 323 is pressed against the side surface of the groove 322. This restricts separation of the projection 323 from the groove 322. Thus, the overlapping portions of the support 30 resist opening and properly support the pressure-sensitive sensor 20.

(2) The projection 323 is located between the pressure-sensitive sensor 20 and the joined parts where the lip 32b and the main body 32a are adhered. This restricts separation of the joined parts.

(3) The pressure-sensitive sensor 20 is enclosed by elastically deforming the lip 32b, which is free from the inserts 321, to accommodate the pressure-sensitive sensor 20 in the support 30. Since the inserts 321 are embedded in the main body 32a, deformation of the main body 32a is limited. This allows the support 30 to properly support the pressure-sensitive sensor 20.

(4) When the surface of the lip 32b includes a groove, elastic deformation of the lip 32b easily changes the shape of the groove. This hinders fitting of a projection into the gap and obstructs positioning of the lip 32b. In the touch sensor unit 10, the groove 322 is located in the surface of the main body 32a that has a higher rigidity than the lip 32b. This limits deformation of the groove 322 and facilitates the fitting of the projection 323 into the groove 322. Thus, the lip 32b can be easily positioned.

(5) The groove 322 includes the side surface inclined so as to become deeper toward the pressure-sensitive sensor 20, and the projection 323 includes the side surface inclined so as to become higher toward the pressure-sensitive sensor 20. Thus, as long as the distal end of the projection 323 is inserted into the groove 322, the projection 323 can be moved along the side surface of the groove 322 toward the pressure-sensitive sensor 20 by pressing the lip 32b against the main body 32a. That is, the projection 323 can be positioned by pressing the lip 32b against the main body 32a using the inclinations of the side surfaces of the groove 322 and the projection 323 as guides for positioning the projection 323. Further, the position of the pressure-sensitive sensor 20 is adjusted by pressing and moving the pressure-sensitive sensor 20 toward the front when the projection 323 is moved forward along the side surface of the groove 322. This reduces the gap between the lip 32b, which encloses the pressure-sensitive sensor 20, and the pressure-sensitive sensor 20.

(6) The protrusions 324 project from the surface of the main body 32a, and the distal end of the lip 32b abuts against the protrusions 324. This allows the lip 32b, which is overlapped with the main body 32a, to be positioned using the protrusions 324 as a reference.

(7) The injection-molded portion 32 can be coupled to the rear door 60 by placing the flat main body 32a on the rear door 60. Thus, as compared to the extruded portion 31 that is coupled to the rear door 60 by sandwiching the flange 60a with the groove-shaped main body 31a, the injection-molded portion 32 can be thinner and coupled to the rear door 60 at a narrower location. Further, such a structure allows the pressure-sensitive sensor 20 to be arranged at a location where the flange 60a cannot be arranged at the front end of the rear door 60.

(8) The extruded portion 31 is arranged at the part where the pressure-sensitive sensor 20 is straight, and the injection-molded portion 32 is arranged at the part where the pressure-sensitive sensor 20 is curved. Further, the construction for enclosing the pressure-sensitive sensor 20 with the lip 32b is employed in the injection-molded portion 32. Thus, the pressure-sensitive sensor 20 can be arranged in a curved state without forming a curved hole.

It should be apparent to those skilled in the art that the present invention may be embodied in many other specific forms without departing from the spirit or scope of the invention. Particularly, it should be understood that the present invention may be embodied in the following forms.

In the above example, the adhesive tape 33 applied to the main body 32a is adhered to the overlapping lip 32b. Instead, the adhesive tape 33 may be applied to the lip 32b and then adhered to the overlapping main body 32a.

The method for joining the lip 32b and the main body 31a is not limited to the adhesion using an adhesive tape. Instead, for example, the lip 32b and the main body 31a may be welded together. Alternatively, the lip 32b and the main body 31a may be fastened together by, for example, clips, screws, or rivets.

In the above example, the main body 32a of the injection-molded portion 32 is fixed to the rear door 60 by the clips 70. However, the method for fixing the main body 32a is not limited to the use of the clips 70. For example, the main body 32a may be adhered to the rear door 60. Further, when fixing the main body 32a by using the clips 70, the clips 70 do not have to be formed from resin. For example, the main body 32a may be fixed using metal clips.

The elastomer forming the support 30 is not limited to an olefinic thermoplastic elastomer and may be, for example, vulcanized rubber. Additionally, the elastomer does not have to be olefinic.

The support 30 does not have to include the inserts 321 and may be formed only from elastomer. Further, the inserts 321 are not limited to stainless steel materials and may be other materials.

The main body 32a may include the projection 323, and the lip 32b may include the groove 322.

As long as the groove 322 and the projection 323 can be fitted to each other, the shapes of the groove 322 and the projection 323 may be changed. For example, as long as the groove 322 and the projection 323 can be fitted to each other, the groove 322 does not have to include a side surface inclined so as to become deeper toward the pressure-sensitive sensor 20. Further, as long as the groove 322 and the projection 323 can be fitted to each other, the projection 323 does not have to include a side surface inclined so as to become higher toward the pressure-sensitive sensor 20. Additionally, the number of the grooves 322 and the number of the projections 323 may be changed. For example, a plurality of grooves 322 and a plurality of projections 323 may be arranged along the parts of the overlapping portions of the support 30 that are adjacent to the pressure-sensitive sensor 20.

The number and shape of the protrusions 324 used for positioning may be changed. For example, the three protrusions 324 of the above touch sensor unit 10 may be changed to a single continuous protrusion.

The positioning protrusions 324 may be omitted.

A reference other than the protrusion 324 may be used to position the lip 32b. For example, the front surface of the main body 32a may include a pattern or recess that indicates the position of the distal end of the lip 32b to position the lip 32b using the pattern or recess as a reference.

The above example includes only one lip 32b. Instead, the lip 32b may be arranged at a number of positions of the support 30. For example, the lip 32b may be divided into a plurality of sections in the longitudinal direction.

In the above example, the support 30 is manufactured by combining injection molding and extrusion. However, the method for manufacturing the support is not limited to such a method. For example, the entire support 30 may be injection-molded. Further, the method for manufacturing the support is not limited to injection molding and extrusion. Additionally, the term "injection molding" in this specification refers to a general method using a mold, and various methods may be used to charge the mold with an elastomer.

The construction for enclosing the pressure-sensitive sensor 20 is not limited to a portion where the pressure-sensitive sensor 20 is curved and may be applied to a portion where the pressure-sensitive sensor 20 is straight. Thus, the construction for enclosing the pressure-sensitive sensor 20 with the lip may be applied to the entire support 30.

The cross section of the pressure-sensitive sensor 20 does not have to be circular. Further, the pressure-sensitive sensor 20 does not have to include four electrode wires 22. In addition, the electrode wires 22 do not necessarily have to be spirally arranged. For example, a pressure-sensitive sensor 20 may include two electrode wires 22 that extend straight and are spaced apart from each other.

The above example illustrates the touch sensor unit 10 that is applied to a power sliding door. However, the touch sensor unit does not have to be applied to a power sliding door and may be applied to, for example, a power window or a power back door to detect contact or entrapment.

Therefore, the present examples and embodiments are to be considered as illustrative and not restrictive and the invention is not to be limited to the details given herein, but may be modified within the scope and equivalence of the appended claims.

The invention claimed is:

1. A touch sensor unit, comprising:
a pressure-sensitive sensor; and
a support that supports the pressure-sensitive sensor, wherein
the support includes overlapping portions which are integral, unitary, and one piece with the support and that include a first portion of the support that is folded and overlapped with a second portion of the support,
the pressure-sensitive sensor is at least partially enclosed by the overlapping portions of the support and is supported by the support,
one of the first portion and the second portion includes a groove, and the other one of the first portion and the second portion includes a projection that projects toward the groove, the projection is fitted into the groove, and the groove includes a first side surface and the projection includes a second side surface that contacts the first side surface to urge the projection against the pressure-sensitive sensor.

2. The touch sensor unit according to claim 1, wherein the overlapping portions of the support include joined parts where the overlapping portions are adhered to each other, and the projection is located between the joined parts and the pressure-sensitive sensor.

3. The touch sensor unit according to claim 1, wherein the second portion is a main body including a metal insert and an elastomer that covers the metal insert, and the first portion is a lip connected to the main body, formed from an elastomer, and free from the metal insert, wherein the lip is folded over the main body to enclose the pressure-sensitive sensor and overlap with the main body.

4. The touch sensor unit according to claim 3, wherein the groove is located in a surface of the main body, and the projection is located on a surface of the lip.

5. The touch sensor unit according to claim 3, wherein a protrusion projects from a surface of the main body, and a distal end of the lip overlapped with the main body abuts against the protrusion.

6. The touch sensor unit according to claim 1, wherein the projection further includes an inner surface that faces toward and contacts with the pressure sensitive sensor.

* * * * *